United States Patent
Shin et al.

(10) Patent No.: US 11,121,716 B2
(45) Date of Patent: Sep. 14, 2021

(54) SEMICONDUCTOR DEVICE FOR ADJUSTING PHASES OF MULTI-PHASE SIGNALS

(71) Applicants: SK hynix Inc., Icheon (KR); Seoul National University R&DB Foundation, Seoul (KR)

(72) Inventors: Soyeong Shin, Uiwang (KR); Han-Gon Ko, Seoul (KR); Deog-Kyoon Jeong, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/027,570

(22) Filed: Sep. 21, 2020

(65) Prior Publication Data
US 2021/0167783 A1 Jun. 3, 2021

(30) Foreign Application Priority Data
Dec. 3, 2019 (KR) .................. 10-2019-0159451

(51) Int. Cl.
*H03L 7/081* (2006.01)
*H03K 5/131* (2014.01)
*G06F 1/10* (2006.01)
*H03K 5/00* (2006.01)

(52) U.S. Cl.
CPC .............. *H03L 7/0814* (2013.01); *G06F 1/10* (2013.01); *H03K 5/131* (2013.01); *H03K 2005/00065* (2013.01)

(58) Field of Classification Search
None
See application file for complete search history.

(56) References Cited

U.S. PATENT DOCUMENTS

2006/0220749 A1* 10/2006 Rosik .................. H03L 7/07
331/12

FOREIGN PATENT DOCUMENTS

| KR | 10-2016-0060515 A | 5/2016 |
|----|---|---|
| KR | 10-2018-0070835 A | 6/2018 |

OTHER PUBLICATIONS

H. W. Lee, et al., "A 1.0 ns/1.0 V Delay Locked Loop With Racing Mode and Countered CAS Latency Controller for DRAM Interfaces", IEEE JSSC, Jun. 2012, vol. 47, No. 6, p. 1436 1447.
Y. Kim, et al., "A 2.3 mW 0.01 mm2 1.25 GHz Quadrature Signal Corrector W ith 1.1-ps Error for Mobile DRAM Interface in 65 nm CMOS", IEEE TCAS II, Apr. 2017, vol. 64, No. 4, p. 397 401.
(Continued)

*Primary Examiner* — Cassandra F Cox

(57) ABSTRACT

A semiconductor device includes a signal delay circuit configured to output a plurality of multi-phase output signals by delaying a plurality of multi-phase input signals according to a plurality of delay codes, respectively; and a calibration circuit including an error detection circuit configured to provide phase difference information between signals selected among the plurality of the multi-phase output signals according to a variable delay code and a filter configured to provide the plurality of delay codes and the variable delay code, wherein the filter performs update operation to update the plurality of delay codes or the variable delay code.

18 Claims, 9 Drawing Sheets

(56) References Cited

OTHER PUBLICATIONS

K. H. Kim, et al., "A 5.4mW 0.0035mm 2 0.45ps rms Jitter 0.8 to 5GHz Non PLL/DLL All Digital Phase Generator/Rotator in 45nm SOI CMOS," ISSCC, 2009, p. 98 99.
J. H. Chae, et al., "A Quadrature Clock Corrector for DRAM Interfaces, With a Duty Cycle and Quadrature Phase Detector Based on a Relaxation Oscillator," IEEE TVLSI, Apr. 2019, vol. 27, No. 4, p. 978 982.
K. J. Hsiao, et al., "A Low Jitter 8 to 10GHz Distributed DLL for Multiple Phase Clock Generation", ISSCC, 2008, pp. 514 632.

* cited by examiner

SEMICONDUCTOR DEVICE FOR ADJUSTING PHASES OF MULTI-PHASE SIGNALS

CROSS-REFERENCE TO RELATED APPLICATION

The present application claims priority under 35 U.S.C. § 119(a) to Korean Patent Application No. 10-2019-0159451, filed on Dec. 3, 2019, which is incorporated herein by reference in its entirety.

BACKGROUND

1. Technical Field

Various embodiments generally relate to a semiconductor device for adjusting phases of multi-phase signals so that phase difference between adjacent signals in phase are constant.

2. Related Art

In multi-phase signals such as a four-phase clock signals, a technique for adjusting phases of multi-phase signals has been developed so that phase differences between signals corresponding to adjacent phases become constant.

For example, in a conventional technique disclosed in Korean Patent Publication No. 10-2016-0060515 A, phases of 4-phase signals are adjusted by using a fixed delay circuit, where only 3 phases among 4 phases of the 4-phase signals are adjusted.

In this case, a remaining phase of the 4-phase signals is fixed at a constant value. This technique requires a relatively long delay to adjust phases, and as the delay amount increases, jitter increases and the quality of the 4-phase signals decreases.

Accordingly, there is a need for a new semiconductor device that can more efficiently adjust phases of multi-phase signals.

SUMMARY

In accordance with an embodiment of the present disclosure, a semiconductor device may include a signal delay circuit configured to output a plurality of multi-phase output signals by delaying a plurality of multi-phase input signals according to a plurality of delay codes, respectively; and a calibration circuit including an error detection circuit configured to provide phase difference information between signals selected from among the plurality of the multi-phase output signals, the phase difference information being determined according to a variable delay code, and a filter configured to provide the plurality of delay codes and the variable delay code, wherein the filter performs an update operation to update one or more of the plurality of delay codes or the variable delay code.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Hereinafter, a technique for adjusting phases of a plurality of multi-phase signals is disclosed using four-phase signals or four-phase clock signals as an example. However, embodiments are not limited to four-phase signals.

The four-phase signals are indicated as I, Q, IB, and QB in phase order, and IN indicating an input signal or OUT indicating an output signal can be added as a subscript.

Figure 1:
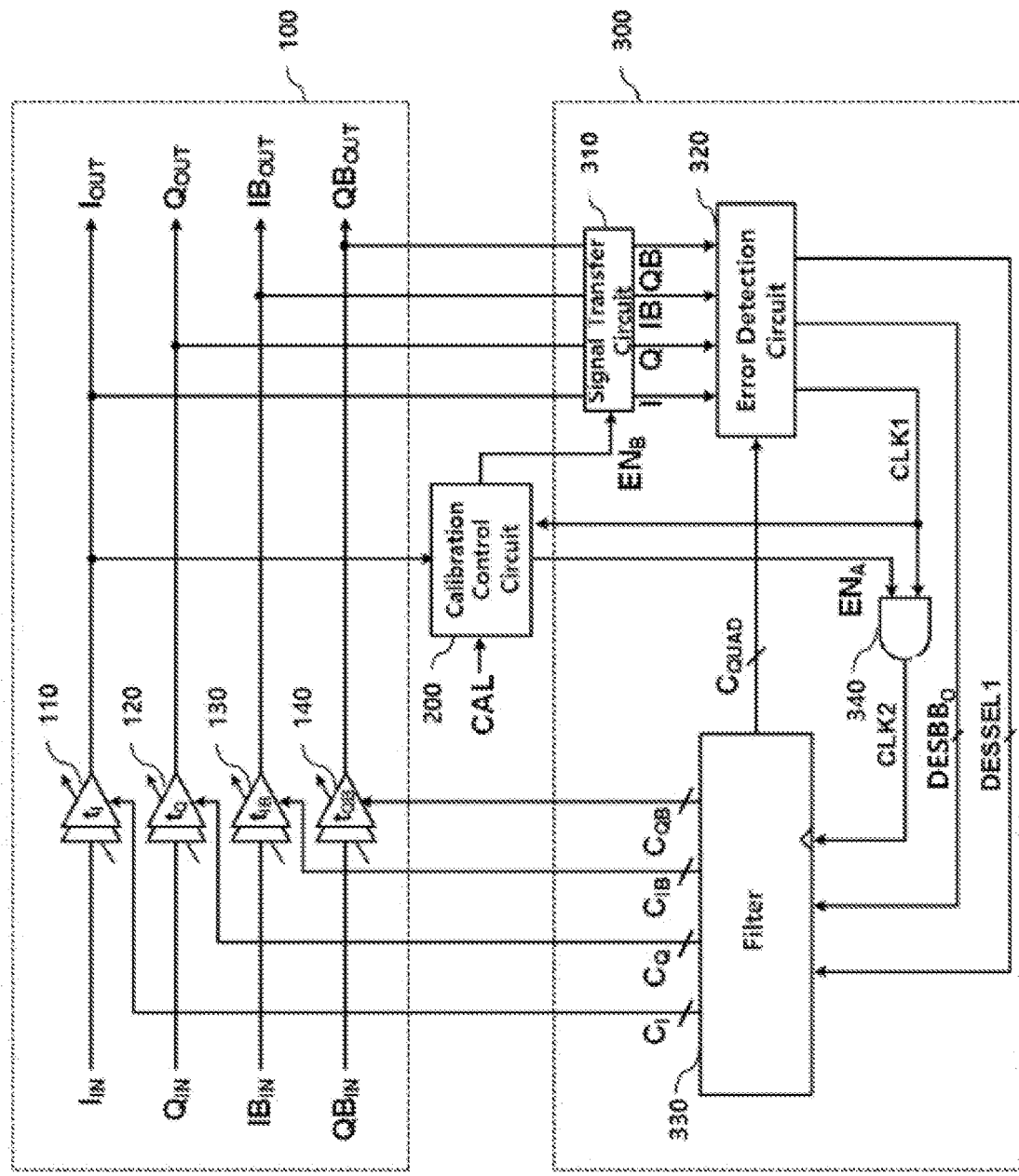
FIG. 1 illustrates a semiconductor device according to an embodiment of the present disclosure.

FIG. 1 shows a block diagram of a semiconductor device according to an embodiment of the present disclosure.

The semiconductor device includes a signal delay circuit 100, a calibration control circuit 200, and a calibration circuit 300.

The signal delay circuit 100 includes a plurality of delay circuits 110, 120, 130, and 140 delaying multi-phase signals $I_{IN}$, $Q_{IN}$, $IB_{IN}$, and $QB_{IN}$ according to delay codes $C_I$, $C_Q$, $C_{IB}$, and $C_{QB}$, respectively.

A first delay circuit 110 delays a first input signal $I_{IN}$ according to a first delay code CI and outputs a first output signal $I_{OUT}$.

A second delay circuit 120 delays a second input signal $Q_{IN}$ according to a second delay code $C_Q$ and outputs a second output signal $Q_{OUT}$.

A third delay circuit 130 delays a third input signal $IB_{IN}$ according to a third delay code $C_{IB}$ and outputs a third output signal $IB_{OUT}$.

A fourth delay circuit 140 delays a fourth input signal $QB_{IN}$ according to a fourth delay code $C_{QB}$ and outputs a fourth output signal $QB_{OUT}$.

The calibration control circuit 200 controls the calibration circuit 300 according to a calibration signal CAL and the calibration circuit 300 updates the first to fifth delay codes $C_I$, $C_Q$, $C_{IB}$, $C_{QB}$, and $C_{QUAD}$.

The calibration signal CAL may be controlled asynchronously.

The calibration control circuit 200 may disable at least a part of the calibration circuit 300 when calibration operation is not being performed to reduce energy consumption.

Figure 2:
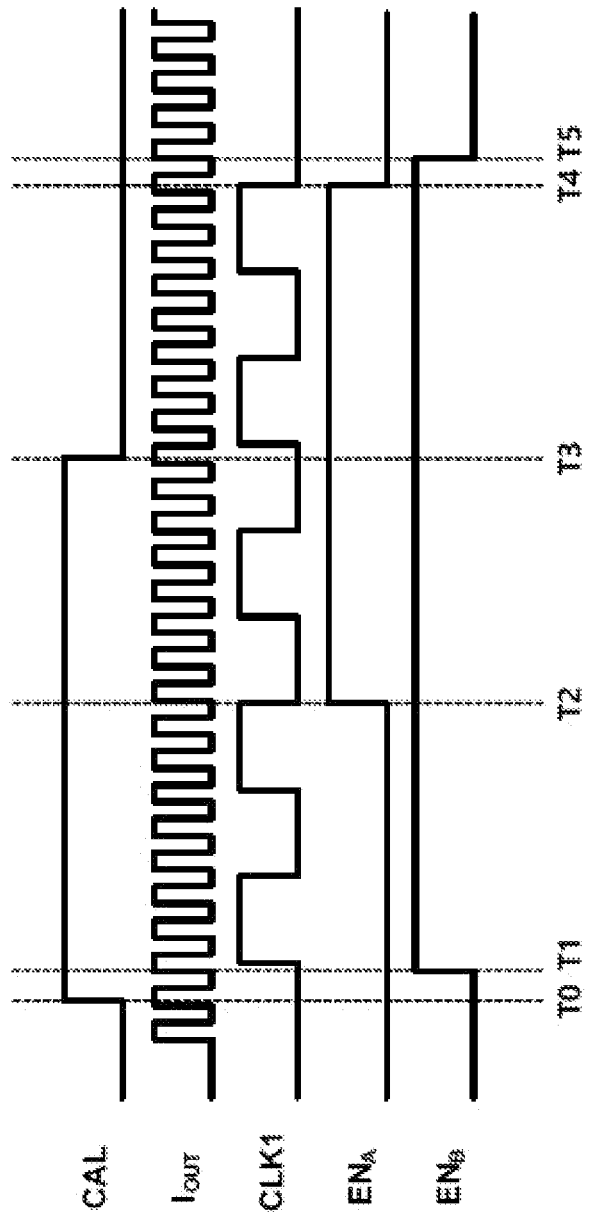
FIG. 2 illustrates a calibration control operation of a semiconductor device according to an embodiment of the present disclosure.

FIG. 2 is a timing diagram illustrating a calibration control operation of the semiconductor device.

The calibration signal CAL is activated between a first time T0 and a fourth time T3.

In this embodiment, the calibration control circuit 200 activates the calibration circuit 300 according to the calibration signal CAL.

A first activation signal $EN_A$ and a second activation signal $EN_B$ may be used to control activation of components of the calibration circuit 300 and/or an activation order of the components of the calibration circuit 300. The operation of the calibration circuit 300 will be described in detail below.

In the present embodiment, when the calibration signal CAL is activated at the first time T0, the second activation signal $EN_B$ is activated at a second time T1 after a predetermined time has elapsed since the first time T0, and the first activation signal $EN_A$ is activated at a third time T2 after a predetermined time has elapsed since the second time T1.

This is described in more detail as follows.

In this embodiment, the calibration control circuit 200 activates the second activation signal $EN_B$ at the second time T1 in response to the first rising edge of the first output signal $I_{OUT}$ after the calibration signal CAL is activated.

In this embodiment, the calibration control circuit 200 activates the first activation signal $EN_A$ at the third time T2 in response to the second falling edge of the first clock signal CLK1 after the calibration signal CAL is activated.

The first clock signal CLK1 is generated inside the calibration circuit 300 while the calibration operation is in progress.

In this embodiment, a signal alternately selected among the first to fourth output signals $I_{OUT}$, $Q_{OUT}$, $IB_{OUT}$, and $QB_{OUT}$ is delayed and divided to generate the first clock signal CLK1 during the period when second activation signal $EN_B$ is activated.

A method of generating the first clock signal CLK1 will be described in detail with reference to FIG. 5 below.

In the embodiment shown in FIG. 2, when the calibration signal CAL is deactivated at the fourth time T3, the first activation signal $EN_A$ is deactivated at a fifth time T4 after a predetermined time has elapsed since a fourth time T3, and the second activation signal $EN_B$ is deactivated at a sixth time T5 after a predetermined time has elapsed since the fifth time T4.

This is described in more detail as follows.

In this embodiment, the calibration control circuit 200 deactivates the first activation signal $EN_A$ at the fifth time T4 in response to the second falling edge of the first clock signal CLK1 after the calibration signal CAL is deactivated.

In this embodiment, the calibration control circuit 200 deactivates the second activation signal $EN_B$ at the sixth time T5 in response to the first rising edge of the first output signal $I_{OUT}$ after the first activation signal $EN_A$ is deactivated.

Figure 3:
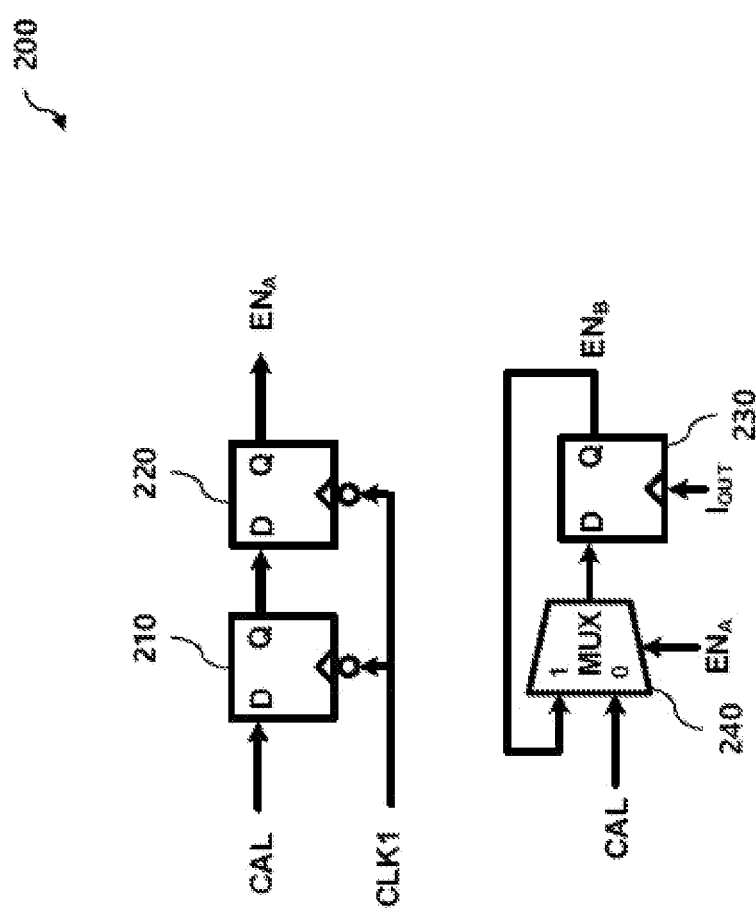
FIG. 3 illustrates a calibration control circuit according to an embodiment of the present disclosure.

FIG. 3 is a circuit diagram showing the calibration control circuit 200.

The calibration control circuit 200 includes first, second, and third flip-flops 210, 220, and 230 and a multiplexer 240.

As described above, in the present embodiment, the first activation signal $EN_A$ is activated at the second falling edge of the first clock signal CLK1 after the calibration signal CAL is activated, and the first activation signal $EN_A$ is deactivated at the second falling edge of the first clock signal CLK1 after the calibration signal CAL is deactivated.

The first flip-flop 210 and the second flip-flop 220 latch respective input signals in synchronization with the falling edge of the first clock signal CLK1.

The calibration signal CAL is input to the first flip-flop 210, an output of the first flip-flop 210 is input to the second flip-flop 220, and the first activation signal $EN_A$ is output from the second flip-flop 220.

The third flip-flop 230 latches an input signal in synchronization with the rising edge of the first output signal $I_{OUT}$ and outputs the second activation signal $EN_B$.

The multiplexer 240 selects a second activation signal $EN_B$ when the first activation signal $EN_A$ is at a high level, and selects a calibration signal CAL when the first activation signal $EN_A$ is at the low level. An output of the multiplexer 240 is provided as the input of the third flip-flop 230.

Accordingly, when the first activation signal $EN_A$ is at the low level, the calibration signal CAL is input to the third flip-flop 230 and the second activation signal $EN_B$ becomes high at the rising edge of the first output signal $I_{OUT}$ while the calibration signal CAL is at the high level.

Returning to FIG. 1, the calibration circuit 300 includes a signal transfer circuit 310, an error detection circuit 320, and a filter 330.

The signal transfer circuit 310 transfers the first to fourth output signals $I_{OUT}$, $Q_{OUT}$, $IB_{OUT}$, and $QB_{OUT}$ to the error detection circuit 320 during a period in which the second activation signal $EN_B$ is activated.

The first to fourth output signals $I_{OUT}$, $Q_{OUT}$, $IB_{OUT}$, and $QB_{OUT}$ when transferred through the signal transfer circuit 310 are referred to as first to fourth signals I, Q, IB, and QB.

The error detection circuit 320 generates a first clock signal CLK1 from the first to fourth signals I, Q, IB, and QB, provides phase difference information DESBBo between the selected signals of the first to fourth signals I, Q, IB, and QB, and generates signal information DESSEL1 corresponding to the phase difference information DESBBo.

The filter 330 performs an update operation of updating the first to fourth delay codes $C_I$, $C_Q$, $C_{IB}$, $C_{QB}$ and a fifth delay code $C_{QUAD}$ using the phase difference information DESBBo and the signal information DESSEL1.

Hereinafter, the fifth delay code $C_{QUAD}$ may be referred to as a variable delay code.

In this embodiment, the update operation of the filter 330 is performed in synchronization with a second clock signal CLK2.

The AND gate 340 performs an AND operation on the first clock signal CLK1 and the first activation signal $EN_A$ to output the second clock signal CLK2.

Accordingly, the filter 330 performs an update operation after a predetermined time has elapsed since signals were transferred through the signal transfer circuit 310.

Figure 4:
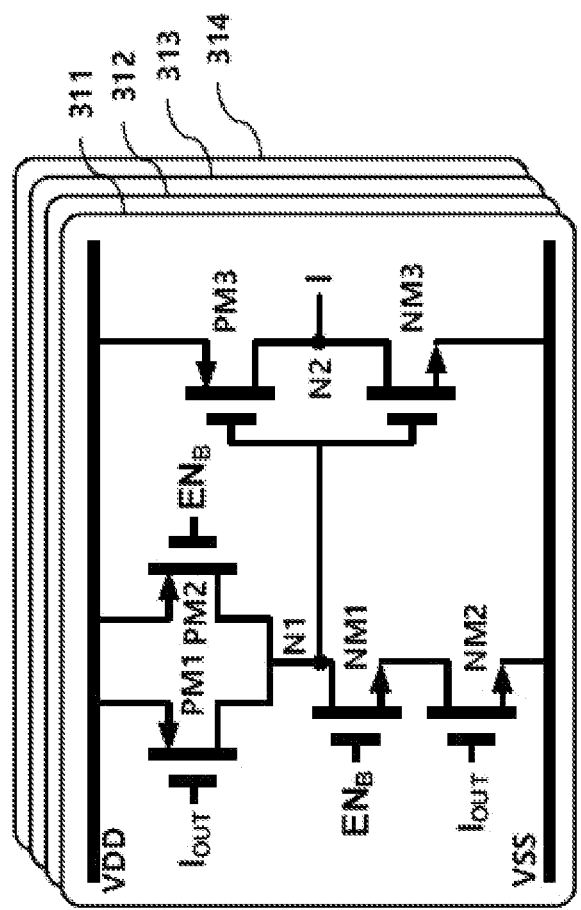
FIG. 4 illustrates a signal transfer circuit according to an embodiment of the present disclosure.

FIG. 4 is a circuit diagram illustrating the signal transfer circuit 310.

The signal transfer circuit 310 includes a first, second, third, and fourth signal transfer circuits 311, 312, 313, and 314 transferring the first, second, third, and fourth output signals $I_{OUT}$, $Q_{OUT}$, $IB_{OUT}$, and $QB_{OUT}$ as the first, second, third, and fourth signals I, Q, IB, and QB, respectively, according to the second activation signal $EN_B$.

The first signal transfer circuit 311 includes a first PMOS transistor PM1 and a second PMOS transistor PM2 coupled in parallel between a first power source VDD and a first node N1. The first output signal $I_{OUT}$ is input to a gate of the first PMOS transistor PM1 and the second activation signal $EN_B$ is input to a gate of the second PMOS transistor PM2.

The first signal transfer circuit 311 includes a first NMOS transistor NM1 and a second NMOS transistor NM2 coupled in series between the first node N1 and the second power supply VSS. The second activation signal $EN_B$ is input to a gate of the first NMOS transistor NM1 and the first output signal $I_{OUT}$ is input to a gate of the second NMOS transistor NM2.

The first signal transfer circuit 311 further includes a third PMOS transistor PM3 and a third NMOS transistor NM3 coupled in series between the first power source VDD and the second power source VSS, and constituting an inverter that inverts a signal of the first node N1 and outputs a first signal I at a second node N2.

Accordingly, when the second activation signal $EN_B$ is at a low level, the voltage of the first node N1 is fixed at the high level, and the first signal I is fixed at the low level.

When the second activation signal $EN_B$ is at the high level, the first signal I corresponds to a signal obtained by buffering the first output signal $I_{OUT}$. That is, the first signal transfer circuit 311 operates as an AND gate that receives the first output signal $I_{OUT}$ and the second activation signal $EN_B$ as inputs and outputs the first signal I.

Because the second to fourth signal transfer circuits 312 to 314 differ only in input and output signals and have substantially the same configuration as the first signal transfer circuit 311, the disclosure thereof will not be repeated.

Figure 5:
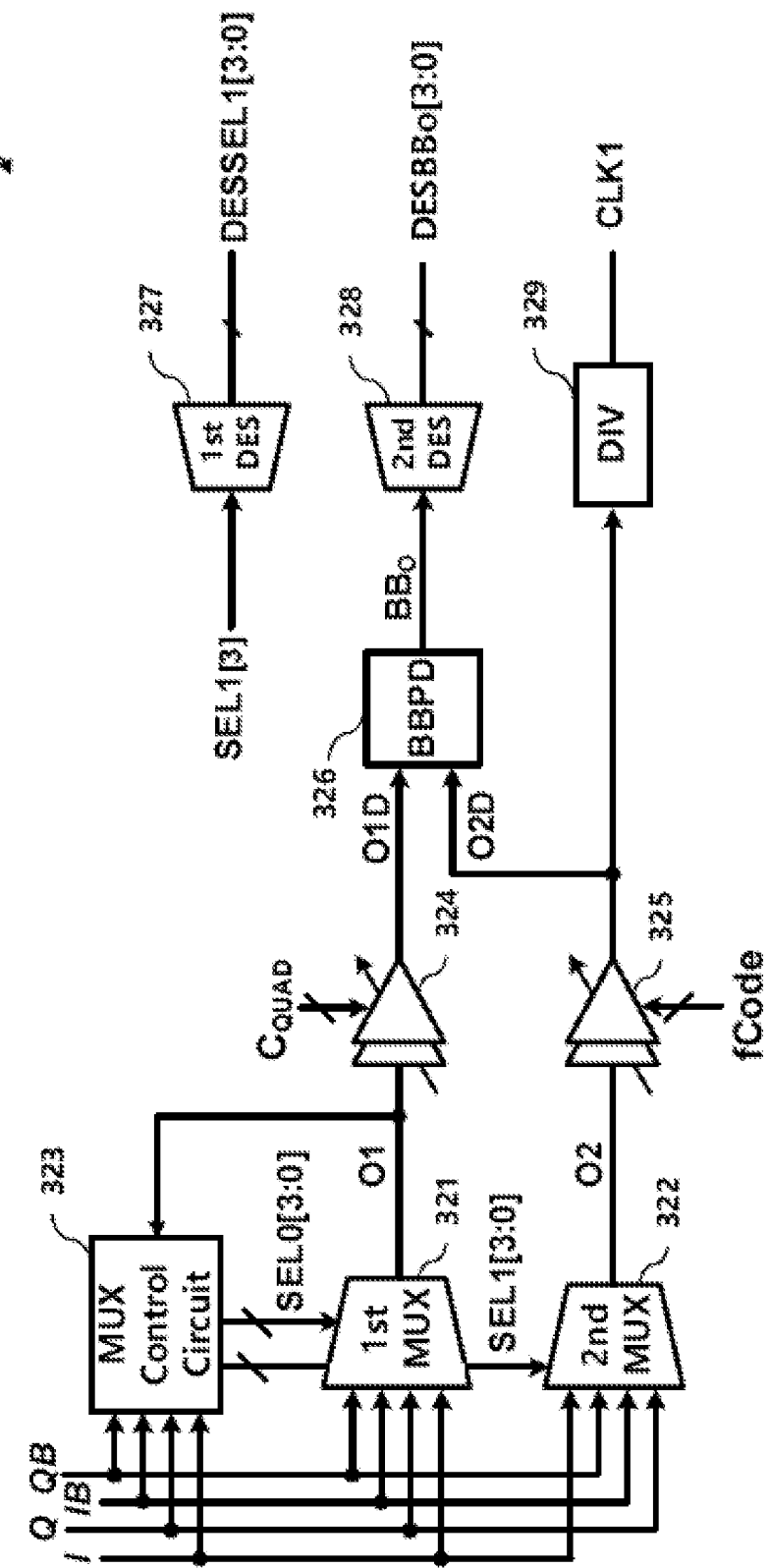
FIG. 5 illustrates an error detection circuit according to an embodiment of the present disclosure.

FIG. 5 is a circuit diagram illustrating the error detection circuit 320.

The error detection circuit 320 includes a first mux 321 for selecting one signal among the first to fourth signals I, Q, IB, and QB and a second mux 322 for selecting an other signal among the first to fourth signals I, Q, IB, and QB.

The error detection circuit 320 includes a mux control circuit 323 that provides a first selection signal SEL0 to the first mux 321 and a second selection signal SEL1 to the second mux 322.

The mux control circuit 323 generates the first selection signal SEL0 and the second selection signal SEL1 so that the first selection output signal O1 output from the first mux 321 and the second selection output signal O2 output from the second mux 322 are from two signals that are adjacent in phase. In the embodiment shown in FIG. 5, the mux control circuit 323 generates the first selection signal SEL0 and the second selection signal SEL1 according to the first to fourth signals I, Q, IB, and QB and a first selection output signal O1 output by the first mux 321.

For example, the mux control circuit 323 may control the first mux 321 so that it selects the first signal I when the second mux 322 selects the second signal Q, selects the second signal Q when the second mux 322 selects the third signal IB, selects the third signal IB when the second mux 322 selects the fourth signal QB, and selects the fourth signal QB when the second mux 322 selects the first signal I.

Figure 6:
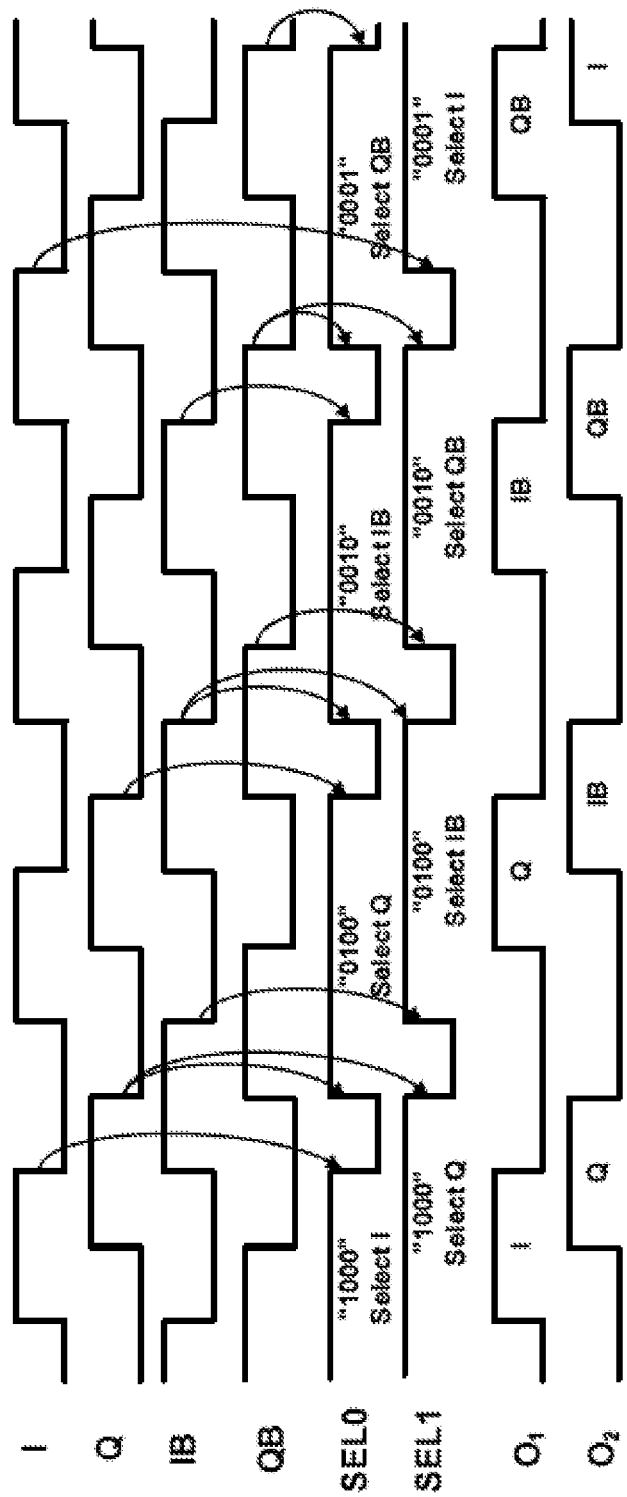
FIG. 6 illustrates an operation of a mux control circuit according to an embodiment of the present disclosure.

FIG. 6 is a timing diagram illustrating the first to fourth signal I, Q, IB, and QB, a first selection signal SEL0, a second selection signal SEL1, a first selection output signal O1, and a second selection output signal O2.

In this embodiment, the first selection signal SEL0 is a 4-bit signal that is "1000" when the first signal I is selected, "0100" when the second signal Q is selected, "0010" when the third signal IB is selected, and "0001" when the fourth signal QB is selected.

In the other cases, that is, when none of the first to fourth signals I to QB are to be selected by the first mux 321, the output of the first mux 321 may be set to the low level and the value of the first selection signal SEL0 may be "0000", but embodiments are not limited thereto.

In the present embodiment, the second selection signal SEL1 is a 4-bit signal that is "1000" when the second signal Q is selected, "0100" when the third signal IB is selected, "0010" when and the fourth signal QB is selected, and "0001" when the first signal I is selected.

In the other cases, that is, when none of the first to fourth signals I to QB are to be selected by the second mux 322, the output of the second mux 322 may be set to the low level and the value of the second selection signal SEL1 may be "0000", but embodiments are not limited thereto.

The value of the first selection signal SEL0 or the second selection signal SEL1 corresponding to the cases where none of the first to fourth signals I to QB are to be selected by the corresponding mux may be referred to as a non-selection value. In this embodiment, it is assumed that the non-selection value is a value of "0000".

Initially, assuming that the first selection signal SEL0 is "1000", the value of the first selection signal SEL0 transitions to "0000" at the falling edge of the first signal I.

Thereafter, the first selection signal SEL0 is updated to "0100" at the falling edge of the second signal Q, selects the second signal Q, and transitions to "0000" at the next falling edge of the second signal Q.

Thereafter, the first selection signal SEL0 is updated to "0010" at the falling edge of the third signal IB, selects the third signal IB, and transitions to "0000" at the next falling edge of the third signal IB.

Thereafter, the first selection signal SEL0 is updated to "0001" at the falling edge of the fourth signal QB, selects the fourth signal QB, and then transitions to "0000" at the falling edge of the fourth signal QB.

The second selection signal SEL1 is updated after a time has elapsed since the first selection signal SEL0 is updated. The time corresponds to a phase difference between two selected signals among the first to fourth signals I, Q, IB, and QB, which is disclosed in detail as below.

Initially, assuming that the second selection signal SEL1 is "1000", the value of the second selection signal SEL1 transitions to "0000" at the falling edge of the second signal Q.

Thereafter, the second selection signal SEL1 is updated to "0100" at the falling edge of the third signal IB, selects the third signal IB, and transitions to "0000" at the next falling edge of the third signal IB.

Thereafter, the second selection signal SEL1 is updated to "0010" at the falling edge of the fourth signal QB, selects the fourth signal QB, and transitions to "0000" at the next falling edge of the fourth signal QB.

Thereafter, the second selection signal SEL1 is updated to "0001" at the falling edge of the first signal I, selects the first signal I, and then transitions to "0000" at the next falling edge of the first signal I.

Accordingly, the first signal I, the second signal Q, the third signal IB, and the fourth signal QB are sequentially output from the first mux 321, and the second signal Q, the third signal IB, the fourth signal QB, and the first signal I are sequentially output from the second mux 322.

In the present embodiment, initial values of the first selection signal SEL0 and the second selection signal SEL1 are set to the same value, but embodiments are not limited thereto.

Because the manner of operation of the mux control circuit 323 according to the initial value is substantially the same and an implementation thereof can be easily determined from the above disclosure, detailed disclosure of the mux control circuit 323 will be omitted.

Returning to FIG. 5, the error detection circuit 320 includes a variable delay circuit 324 and a fixed delay circuit 325.

The variable delay circuit 324 outputs a variable delay signal O1D by delaying the first selection output signal O1 according to a variable delay code, that is, a fifth delay code $C_{QUAD}$, and the fixed delay circuit 325 outputs a fixed delay signal O2D by delaying the second selection output signal O2 according to a fixed delay code fCode.

In this embodiment, the fixed delay code fCode is a value that is fixed during the operation of the calibration circuit 300 and may be set to a minimum value in an adjustable range.

The error detection circuit 320 includes a phase comparator 326.

In an embodiment, the phase comparator 326 is a Bang-Bang Phase Detector (BBPD).

In this embodiment, the phase comparator 326 compares a phase of the variable delay signal O1D output from the variable delay circuit 324 and a phase of the fixed delay signal O2D output from the fixed delay circuit 325 to produce the comparison signal BBo.

In this embodiment, the phase comparator 326 outputs a low level signal when the phase of the variable delay signal O1D is advanced relative to the fixed delay signal O2D, and outputs a high level signal when the phase of the fixed delay signal O2D is advanced relative to the variable delay signal O1D. In an embodiment, a phase of a first signal is advanced relative to (that is, precedes) a phase of a second signal when a rising edge of the first signal occurs after a falling edge of the second signal but before a rising edge of the second signal that follows the falling edge of the second signal. In another embodiment, the phase of the first signal is advanced relative to the phase of the second signal when the falling edge of the first signal occurs after the rising edge of the second signal but before the falling edge of the second signal that follows the rising edge of the second signal.

In this embodiment, the error detection circuit 320 further is includes a first parallelization circuit 327, a second parallelization circuit 328, and a divider 329.

The first parallelization circuit 327 parallelizes a signal corresponding to the most significant bit of the first selection signal SEL1 into a 4-bit signal according to the fixed delay signal O2D.

The signal information DESSEL1 output from the first parallelization circuit 327 may be used to identified which signals were compared for each bit of phase difference information DESBBo.

The second parallelization circuit 328 parallelizes the comparison signal BBo to produce the 4-bit phase difference information DESBBo according to the fixed delay signal O2D.

The phase difference information DESBBo output from the second parallelization circuit 328 stores four phase comparison results between adjacent signals.

The divider 329 divides the fixed delay signal O2D by four to generate a first clock signal CLK1, where 4 corresponds to number of phases in the multi-phase clock signals. Because the fixed delay signal O2D is produced by sequentially selecting each of the first to fourth signals I, Q, IB, and QB, then as shown in FIG. 2, a frequency of the first clock signal CLK1 may be one-fifth a frequency of the first to fourth signals I, Q, IB, and QB.

The first clock signal CLK1 becomes a reference for a calibration operation. During one cycle of the first clock signal CLK1, the phase of each adjacent pair of the first to fourth signals I, Q, IB, and QB are respectively compared to produce the four bits of the phase difference information DESBBo.

Returning to FIG. 1, the AND gate 340 generates a second clock signal CLK2 through which the first clock signal CLK1 passes in a period in which the first activation signal $EN_A$ has the high level.

The filter 330 performs an update operation on the rising edge of the second clock signal CLK2. The delay in the first activation signal $EN_A$ having the high level relative to the second activation signal $EN_B$ having the high level provides the time needed by the error detection circuit 320 to produce the phase difference information DESBBo needed for the update operation.

The filter 330 performs the update operation using the phase difference information DESBBo that stores the results of the phase comparisons between pairs of adjacent signals and using the signal information DESSEL1 that indicates which pair of adjacent signals were compared to produce each bit of the phase difference information DESBBo. For example, in an embodiment, the signal information DESSEL1[3:0] having a value of "1000" may indicate that bit 3 of the phase difference information DESBBo indicates the result of comparing the first signal I to the second signal Q, bit 2 indicates the result of comparing the second signal Q to the third signal IB, bit 1 indicates the result of comparing the third signal IB to the fourth signal QB, and bit 0 indicates the result of comparing the fourth signal QB to the first signal I; the signal information DESSEL1[3:0] having a value of "0100" may indicate that bit 3 of the phase difference information DESBBo indicates the result of comparing the second signal Q to the third signal IB, bit 2 indicates the result of comparing the third signal IB to the fourth signal QB, bit 1 indicates the result of comparing the fourth signal QB to the first signal I, and bit 0 indicates the result of comparing the first signal I to the second signal Q; and so on.

Figure 7:
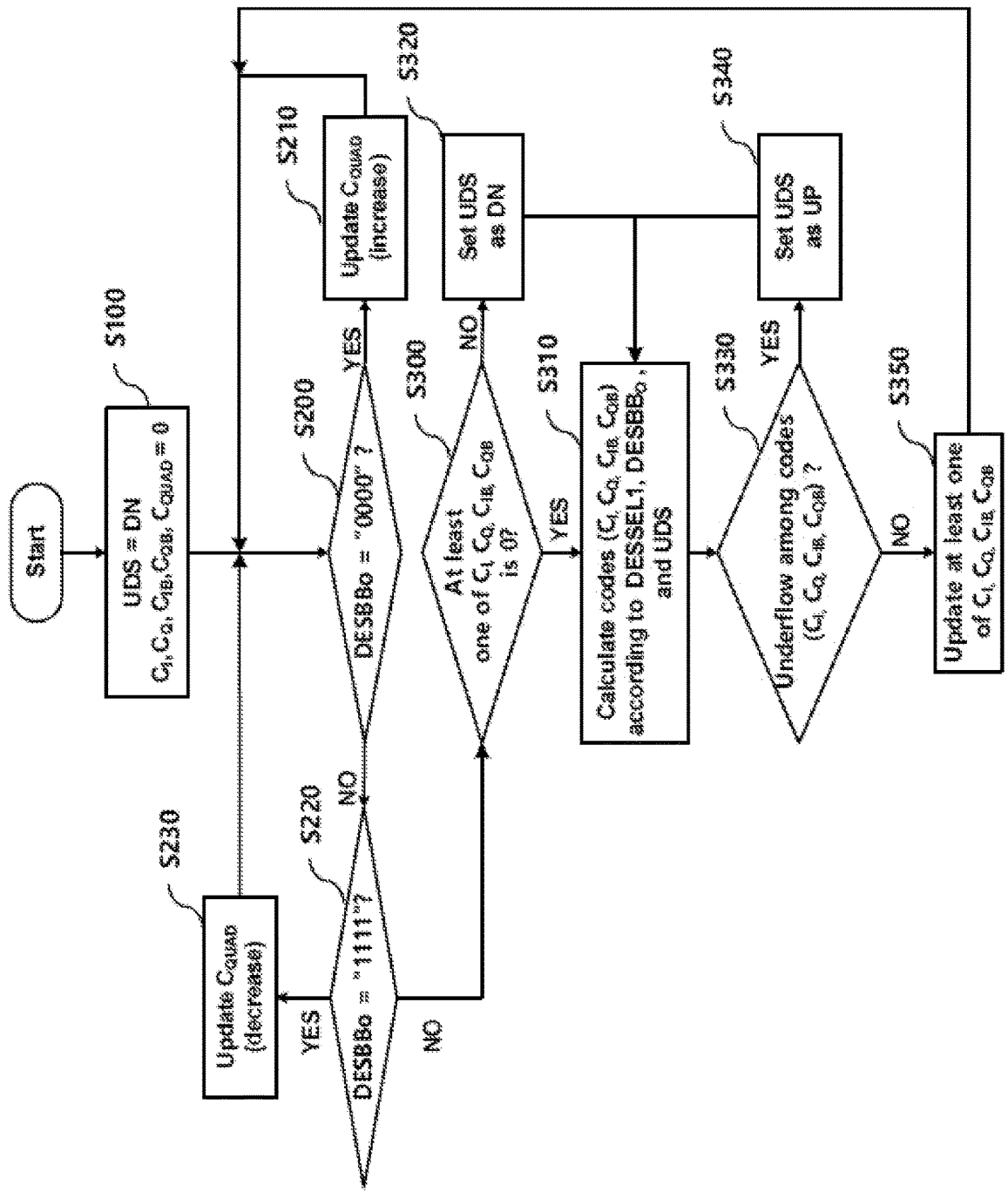
FIG. 7 illustrates a calibration operation of a filter according to an embodiment of the present disclosure.

FIG. 7 is a flowchart showing the delay code update operation of the filter 330.

Among the operations described in the flowchart of FIG. 7, an operation corresponding to step S100 may be performed when an initialization step or a calibration operation is first performed during the initialization of the semiconductor device.

In an embodiment, the operation of step S200 starts at the rising edge of the second clock signal CLK2, and the operation up to step S350 may be performed during one period of the second clock signal CLK2.

In the initialization step S100, a direction flag UDS is set to DN, and the values of the first to fifth delay codes $C_I$, $C_Q$, $C_{IB}$, $C_{QB}$, and $C_{QUAD}$ are set to respective predetermined values. The predetermined values may be 0, for example.

Initial values of the first to fifth delay codes may be determined differently according to embodiments.

When the update operation starts, whether all the bits of the phase difference information DESBBo are 0 (that is, whether DESBBo="0000") is checked at step S200.

If all the bits are 0, this indicates that the fifth delay code $C_{QUAD}$ should be increased, and accordingly the update operation proceeds to step S210 to update the fifth delay code $C_{QUAD}$ by increasing it. Otherwise the update operation proceeds to step S220.

If all the bits are not 0, whether all bits of the phase difference information DESBBo are 1 (that is, whether DESBBo="1111") is checked at step S220.

If all the bits are 1, this indicates that the fifth delay code $C_{QUAD}$ should be decreased, and accordingly the update operation proceeds to step S230 to update the fifth delay code $C_{QUAD}$ by decreasing it.

If all the bits are not 1, that is, if one or more bits are 0 and one or more other bits are 1 in the phase difference information DESBBo, the update operation proceeds to step S300.

First, whether at least one of the first to fourth delay codes $C_I$, $C_Q$, $C_{IB}$, and $C_{QB}$ is 0 is checked at step S300. When at least one of the first to fourth delay codes $C_I$, $C_Q$, $C_{IB}$, and $C_{QB}$ is zero, the update operation proceeds to step S310; otherwise the update operation proceeds to step S320.

When at least one of the first to fourth delay codes is 0, the update operation proceeds to step S310, and a delay code to be updated is selected and an update value for the selected delay code calculated according to the signal information DESSEL1, the phase difference information DESBBo, and the direction flag UDS at step S310.

When none of the first to fourth delay codes are 0, the direction flag UDS is set to DN at step S320, the update operation proceeds to step S310, and a delay code to be updated is selected and an update value for the selected delay code is calculated at step S310.

Then, whether underflow occurs in the calculated update value for the selected delay code is determined at step S330.

Underflow means that the update value for the selected delay code has become less than the minimum value, that is, it has become negative.

When underflow occurs, the update operation proceeds to step S340, the direction flag UDS is set to UP at step S340, the update operation then returns to step S310, and a delay code to be updated is selected again and a new update value calculated at step S310 using the new value of the direction flag UDS.

If underflow does not occur, the update operation proceeds to step S350, and at least one of the first to fourth delay codes is updated according to the update value calculated for that delay code at step S350.

Thereafter, the update operation returns to step S200, and the operation beginning at step S200 is repeated in response to the next rising edge of the second clock signal CLK2.

Hereinafter, a method of calculating the code in step S310 will be described in detail.

Figure 8:
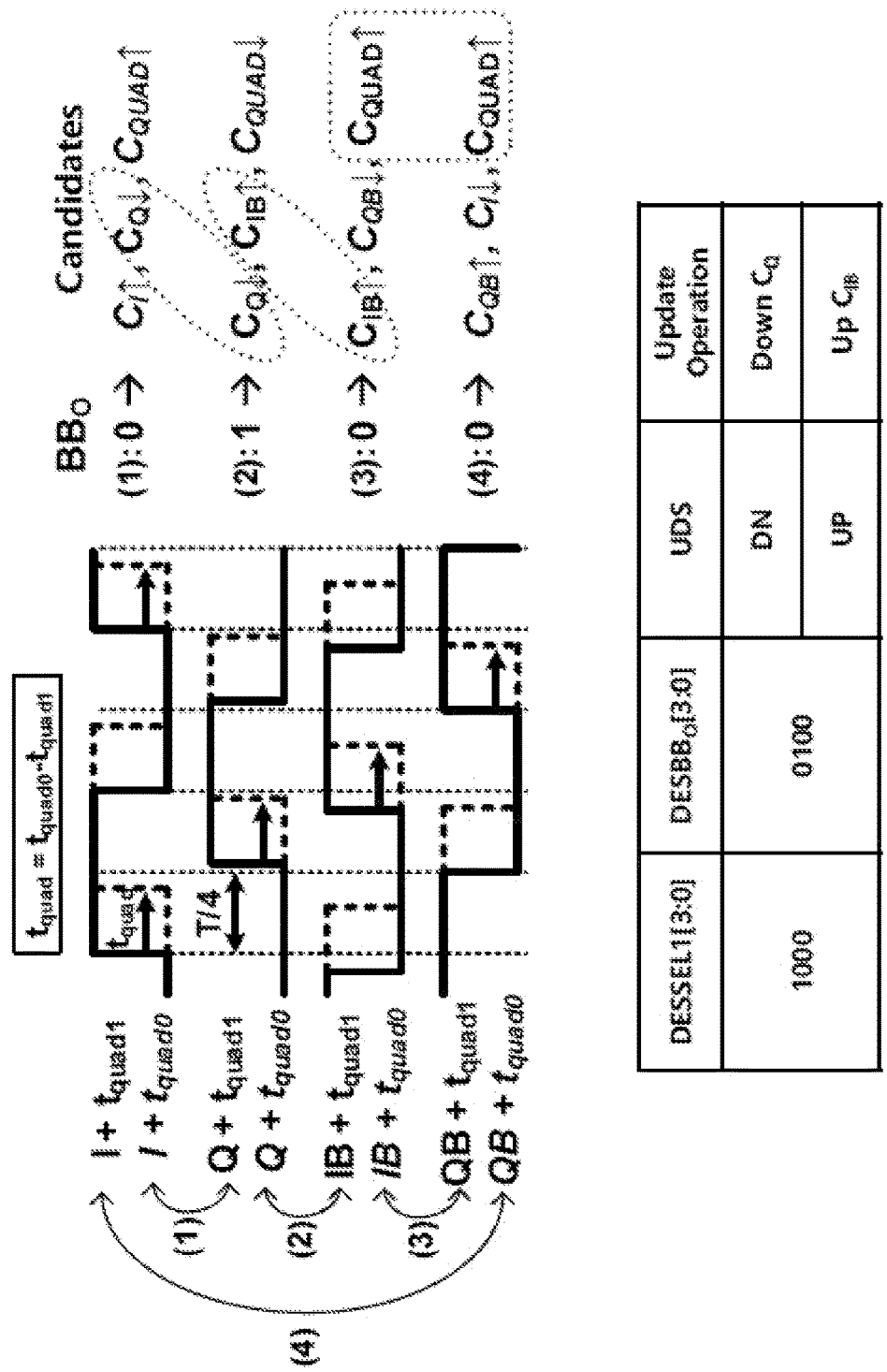
FIGS. 8 and 9 illustrate a calibration operation of a filter according to an embodiment of the present disclosure.
Figure 9:
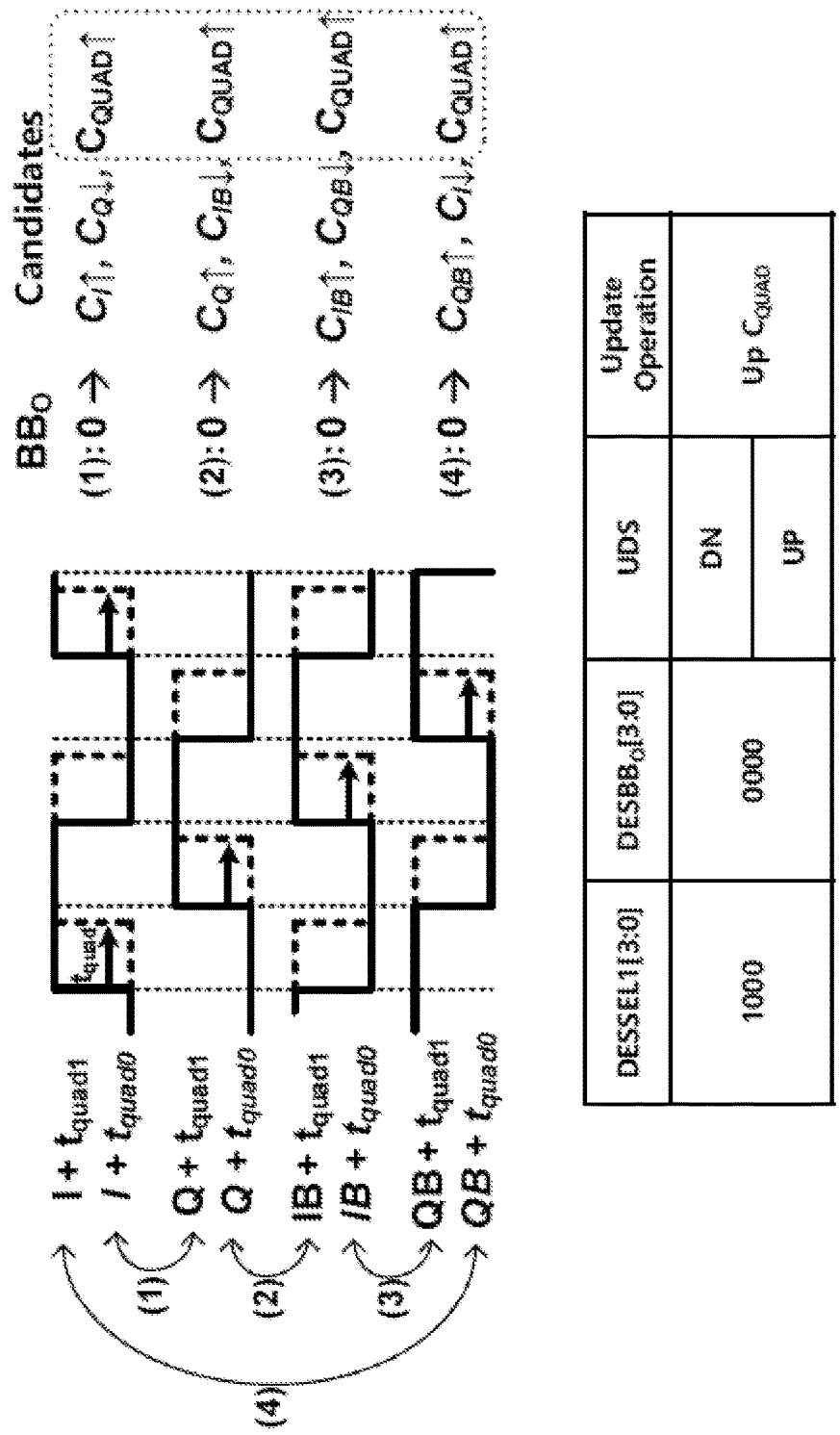

FIGS. 8 and 9 illustrates an operation of selecting a code to be updated in the filter 330.

In FIGS. 8 and 9, the delay amount of the variable delay circuit 324 is denoted by $t_{quad0}$ and the delay amount of the fixed delay circuit 325 is denoted by $t_{quad1}$.

Also, the adjacent vertically dotted lines have a phase difference of 90 degrees from each other.

In addition, in the timing diagram, the dotted line represents the variable delay signal O1D output from the variable delay circuit 324, and the solid line represents the fixed delay signal O2D output from the fixed delay circuit 325.

It is assumed that a comparison target signal and a phase comparison result are obtained as shown from the signal information DESSEL1 and the phase difference information DESBBo.

(1) is a case where the first signal I is selected by the first mux 321 and the second signal Q is selected by the second mux 322.

At this time, the variable delay signal O1D is described as I+$t_{quad0}$ in consideration of the delay time $t_{quad0}$ of the first signal I and the variable delay circuit 324, and is represented by the dotted line of the first row of the timing diagram.

In addition, the fixed delay signal O2D is described as t Q+$t_{quad1}$ in consideration of the second signal Q and the delay time $t_{quad1}$ of the fixed delay circuit 325, and is represented by the solid line of the second row of the timing diagram.

In addition, the difference between the delay time $t_{quad0}$ of the variable delay circuit 324 and the delay time $t_{quad1}$ of the fixed delay circuit 325 is expressed as $t_{quad}$. In embodiments, the update operation described with respect to FIG. 7 operates to adjust the fifth delay code $C_{quad}$ (that is, the variable delay code) so that $t_{quad}$ corresponds to the desired time difference between adjacent phases of the multi-phase signals.

In the case (1), because the phase of the variable delay signal O1D corresponding to the variable delay code (dashed line, row 1) precedes the phase of the fixed delay signal O2D corresponding to the fixed delay code (solid line, row 2), the value of the comparison signal has the low level, that is, a value of '0'.

In this case, in order to align the variable delay signal O1D and the fixed delay signal O2D input to the phase comparator 326, the first to fifth delay codes may be adjusted to increase the delay for the first signal I, to decrease the delay for the second signal Q, or to increase the delay of the variable delay signal O1D by increasing the delay provided by the variable delay circuit 324.

To this end, the first delay code $C_I$ may be increased, the second delay code $C_Q$ may be decreased, or the fifth delay code $C_{QUAD}$ may be increased.

(2) is a case where the second signal Q is selected by the first mux 321 and the third signal IB is selected by the second mux 322.

In the case (2), because the phase of the variable delay signal O1D corresponding to the variable delay code (dashed line, row 2) is behind the phase of the fixed delay signal O2D corresponding to the fixed delay code (solid line, row 3), the value of the comparison signal has a high level, that is, a value of '1'.

In this case, in order to align the variable delay signal O2D input to the phase comparator 326 and the fixed delay signal O1D, the first to fifth delay codes can be adjusted to decrease the delay for the second signal Q, to increase the delay for the third signal IB, or to decrease the delay for the variable delay signal O1D by decreasing the delay provided by the variable delay circuit 324.

To this end, the second delay code $C_Q$ may be decreased, the third delay code $C_{IB}$ may be increased, or the fifth delay code $C_{QUAD}$ may be decreased.

(3) is a case where the third signal IB is selected by the first mux 321 and the fourth signal QB is selected by the second mux 322.

In the case (3), because the phase of the variable delay signal O1D corresponding to the variable delay code (dashed line, row 3) precedes the phase of the fixed delay signal O2D corresponding to the fixed delay code (solid line, row 4), the value of the comparison signal has a low level, that is, a value of '0'.

In this case, in order to align the signals input to the phase comparator 326, the first to fifth delay codes may be adjusted to increase the delay for the third signal IB, to decrease the for delay the fourth signal QB, or to increase the delay for the variable delay signal O1D by increasing the delay provided by the variable delay circuit 324.

To this end, the third delay code $C_{IB}$ may be increased, the fourth delay code $C_{QB}$ may be decreased, or the fifth delay code $C_{QUAD}$ may be increased.

(4) is a case where the fourth signal QB is selected by the first mux 321 and the first signal I is selected by the second mux 322.

In the case (4), because the phase of the variable delay signal O1D corresponding to the variable delay code (dashed line, row 4) precedes the phase of the fixed delay signal O2D corresponding to the fixed delay code (solid line, row 1), the comparison signal has a low level, that is, a value of '0'.

In this case, in order to align the signals input to the phase comparator 326, the first to fifth delay codes may be adjusted to increase the delay for the fourth signal QB, to decrease the delay for the first signal I, or to increase the delay for the variable delay signal O1D by increasing the delay provided by the variable delay circuit 324.

To this end, the fourth delay code $C_{QB}$ may be increased, the first delay code $C_I$ may be decreased, or the fifth delay code $C_{QUAD}$ may be increased.

As described above, in cases (1) to (4), an update direction of each of the first to fifth delay codes may be candidates.

In FIG. 8, because some of the phase difference information DESBBo is 0 (i.e., the "NO" path of FIG. 7, S220), and some is 1 (i.e., the "NO" path of FIG. 7, FIG. 7, S200), the code to be updated is selected from the first to fourth delay codes $C_I$, $C_Q$, $C_{IB}$, $C_{QB}$ without updating the fifth delay code $C_{QUAD}$.

When the direction flag UDS is set to DN, a candidate that may be set in a direction in which the delay amount decreases in two or more cases is selected.

Accordingly, in the case of FIG. 8, among the candidates, because a decrease in the second delay code $C_Q$ is a candidate in both cases (1) and (2), it is determined to decrease the second delay code $C_Q$ when the direction flag UDS is set to DN.

In this case, the second delay code $C_Q$ may be reduced by a predetermined size from the existing value. The predetermine size may be, for example, the unit size 1, but may be set to a different value according to embodiments.

When the direction flag UDS is set to UP, a candidate that may be set in a direction in which the delay amount increases in two or more cases is selected.

In the case of FIG. 8, because an increase in the third delay code $C_{IB}$ is a candidate in both cases (2) and (3), the third delay code $C_{IB}$ is selected and increased when the direction flag UDS is set to UP.

In this case, the third delay code $C_{IB}$ may be increased by a predetermined size from the existing value. The predetermine size may be, for example, the unit size 1, but may be set to a different value according to embodiments.

In FIG. 8, the signal information DESSEL1 is given as "1000", which indicates that the second signal Q was initially selected by the second mux 322, and thereafter, the third signal IB, the fourth signal QB, and the first signal I were sequentially selected.

In FIG. 8, the table at the bottom of the figure can be viewed as a part of a lookup table referenced by the filter 330 for an update operation.

The lookup table may store in advance one or more entries for combinations of the phase difference information DESBBo, the signal information DESSEL1, and the direction flag UDS, each entry indicating a signal to be selected and an update direction thereof.

Accordingly, during an update operation, the filter 330 can quickly determine a signal to be updated and an update direction by accessing the lookup table using the phase difference information DESBBo, the signal information DESSEL1, and the direction flag UDS.

In FIG. 9, unlike FIG. 8, all values of the phase difference information DESBBo are "0". FIG. 9 shows update candidates for the first to fifth delay codes in all cases (1) to (4).

FIG. 9 shows a case in which the phase difference information DESBBo is "0000", and as a result the fifth delay code $C_{QUAD}$ is updated to be increased regardless of the direction flag UDS.

In this case, the fifth delay code $C_{QUAD}$ may be increased by a predetermined size from the existing value. The predetermine size may be, for example, the unit size 1, but may be set to a different value according to embodiments.

Similarly to in FIG. 8, in FIG. 9, the table at the bottom may be viewed as a part of the lookup table referenced by the filter 330 for the update operation.

As long as the calibration signal CAL does not become the low level, the operations of FIGS. 7 to 9 may be repeatedly performed in synchronization with the second clock signal CLK2.

As described above, the calibration signal CAL may be provided asynchronously from outside the calibration control circuit 200.

However, even when the update operation is performed, if the values of the first to fifth delay codes converge around a constant set of respective values, the calibration may be stopped.

In this case, the filter 330 may monitor values of the first to fifth delay codes and provide a locking flag.

In this case, when the locking flag is activated, the calibration control circuit 200 may be designed to operate in the same manner as when the calibration signal CAL is deactivated.

For example, referring to FIG. 3, a mux circuit for selecting 0 or the calibration signal CAL according to the locking flag may be additionally provided, and the output thereof may be provided as an input of the first flip-flop 210 or may be provided to the multiplexer 240.

Accordingly, it may be additionally provided a means may be provided for forcibly deactivating the calibration signal CAL and the locking flag when both the first activation signal $EN_A$ and the second activation signal $EN_B$ are deactivated, which is similar to when the calibration signal CAL is deactivated.

In another embodiment, an element for automatically activating the calibration signal CAL at regular time intervals may be provided so that the phase of the multiphase signals can be adjusted without waiting for an asynchronous input.

Although various embodiments have been illustrated and described, various changes and modifications may be made to the described embodiments without departing from the spirit and scope of the invention as defined by the following claims.

What is claimed is:

1. A semiconductor device comprising:
   a signal delay circuit configured to output a plurality of multi-phase output signals by delaying all of a plurality of multi-phase input signals according to a plurality of delay codes, respectively; and
   a calibration circuit including:
      an error detection circuit configured to provide phase difference information between signals selected from among the plurality of the multi-phase output signals, the phase difference information being determined according to a variable delay code, and
      a filter configured to provide the plurality of delay codes and the variable delay code, wherein the filter performs an update operation to update one or more of the plurality of delay codes or the variable delay code.

2. The semiconductor device of claim 1, wherein the error detection circuit comprises:
a variable delay circuit configured to delay one signal of two signals adjacent in phase among the plurality of multi-phase output signals according to the variable delay code;
a fixed delay circuit configured to delay by a fixed delay the other signal of the two signals adjacent in phase among the plurality of multi-phase output signals; and
a phase comparator configured to compare a phase of the output of the variable delay circuit and a phase of the output of the fixed delay circuit, and output a comparison signal having a low level when the phase of the output of the variable delay circuit precedes the phase of the output of the fixed delay circuit and having a high level when the phase of output of the fixed delay circuit precedes the phase of the output of the variable circuit,
wherein the phase difference information is generated from the comparison signal output of the phase comparator.

3. The semiconductor device of claim 2, wherein the error detection circuit further comprises:
a first mux configured to select the one signal according to a first selection signal;
a second mux configured to select the other signal according to a second selection signal;
a mux control circuit providing the first selection signal and the second selection signal;
a divider configured to generate a first clock signal by dividing an output of the fixed delay circuit by N; and
a first parallelization circuit configured to parallelize an output of the phase comparator according to an output signal of the fixed delay circuit,
wherein N corresponds to a number of the plurality of the multi-phase output signals.

4. The semiconductor device of claim 3,
wherein the mux control circuit outputs the first selection signal and the second selection signal so that the phase comparator outputs N comparison signals sequentially, and
wherein the first parallelization circuit parallelizes the N comparison signals to generate the phase difference information.

5. The semiconductor device of claim 4,
wherein the filter increases the variable delay code when the N comparison signals all have the low level,
wherein the filter decreases the variable delay code when the N comparison signals all have the high level, and
wherein the filter increases or decreases one of the plurality of delay codes when at least one of the N comparison signals has the low level and at least one other of the N comparison signals has the high level.

6. The semiconductor device of claim 5, wherein the filter includes a direction flag,
wherein the filter increases the one of the plurality of delay codes when the at least one of the N comparison signals has the first value, the at least one other of the N comparison signal phase difference has the second value, and the direction flag as a value corresponding to up, and
wherein the filter decreases the one of the plurality of delay codes when the at least one of the N comparison signals has the first value, the at least one other of the N comparison signal phase difference has the second value, and the direction flag as a value corresponding to down.

7. The semiconductor device of claim 6,
wherein the filter sets the direction flag to the value corresponding to down when none of the plurality of delay codes have a value of zero, and
wherein the filter sets the direction flag to the value corresponding to up when the direction flag has the value corresponding to down and decreasing the one of the plurality of delay codes would cause an underflow of the one of the plurality of delay codes.

8. The semiconductor device of claim 6, wherein the filter further comprises a lookup table referred to using the phase difference information and the direction flag, wherein the lookup table stores update information of the plurality of delay codes corresponding to the phase difference information.

9. The semiconductor device of claim 3, further comprising a second parallelization circuit configured to parallelize the second selection signal according to an output signal of the fixed delay circuit to generate signal information indicating compared signals corresponding to each of the N comparison signals.

10. The semiconductor device of claim 1, wherein the calibration circuit further comprises a logic circuit controlling the filter according to a first activation signal, and a signal transfer circuit transferring the plurality of multi-phase signals to the error detection circuit according to a second activation signal.

11. The semiconductor device of claim 1, further comprising a calibration control circuit controlling the calibration circuit according to a calibration signal.

12. The semiconductor device of claim 11,
wherein the calibration control circuit generates a first activation signal and a second activation signal according to the calibration signal,
wherein the first activation signal and the second activation signals are activated after the calibration signal is activated and deactivated after the calibration signal is deactivated, and
wherein the first activation signal is activated after the second activation signal is activated and deactivated before the second activation signal is deactivated.

13. A method of operation for a semiconductor device to adjust phases of a plurality of input signals, the method comprising:
delaying the plurality of input signals by a plurality of delay codes to produce a plurality of output signals;
for each of the plurality of output signals:
generating a corresponding variable delay signal by delaying the output signal according to a variable delay code,
generating a corresponding fixed delay signal by delaying by a fixed delay an output signal corresponding to a phase adjacent to a phase corresponding to the output signal, and
generating a corresponding comparison signal by comparing a phase of the corresponding variable delay signal to a phase of the corresponding fixed delay signal, the corresponding comparison signal having a first value when the phase of corresponding variable delay signal precedes the phase of the corresponding fixed delay signal and having a second value when the phase of corresponding fixed delay signal precedes the phase of the corresponding variable delay signal; and adjusting, according to the comparison signals corresponding to the plurality of output signals, one or more of the plurality of delay codes or the variable delay code.

14. The method of claim 13, wherein adjusting the plurality of delay codes or the variable delay code comprises:

increasing the variable delay code when all of the comparison signals corresponding to the plurality of output signals have the first value; and decreasing the variable delay code when all of the comparison signals corresponding to the plurality of output signals have the second value.

15. The method of claim 13, wherein adjusting the one or more of the plurality of delay codes or the variable delay code comprises:

increasing or decreasing one of the plurality of delay codes when at least one of the comparison signals corresponding to the plurality of output signals has the first value and at least an other one of the comparison signals corresponding to the plurality of output signals has the second value.

16. The method of claim 15, wherein adjusting the one or more of the plurality of delay codes or the variable delay code comprises:

increasing the one of the plurality of delay codes when a direction flag has a value corresponding to up, and decreasing the one of the plurality of delay codes when the direction flag has a value corresponding to down.

17. The method of claim 16, further comprising:

setting the direction flag to the value corresponding to down when none of the plurality of delay codes has a value of zero, and setting the direction flag to the value corresponding to up when the direction flag has the value corresponding to down and decreasing the one of the plurality of delay codes would cause an underflow of the one of the plurality of delay codes.

18. The method of claim 15, further comprising:

determining the one of the plurality of delay codes to increase or decrease and whether to increase or decrease the one of the plurality of delay codes using a lookup table referred to using the comparison signals corresponding to the plurality of output signals and the direction flag.

\* \* \* \* \*